United States Patent
Zavis

(10) Patent No.: US 9,410,988 B2
(45) Date of Patent: Aug. 9, 2016

(54) CABLE WITH LED CONNECTION INDICATOR AND METHODS OF USING SAME

(71) Applicant: Meggitt (Orange County), Inc., Irvine, CA (US)

(72) Inventor: Wayne Zavis, San Juan Capistrano, CA (US)

(73) Assignee: MEGGITT (ORANGE COUNTY), INC., Irvine, CA (US)

( * ) Notice: Subject to any disclaimer, the term of this patent is extended or adjusted under 35 U.S.C. 154(b) by 177 days.

(21) Appl. No.: 14/153,997

(22) Filed: Jan. 13, 2014

(65) Prior Publication Data

US 2014/0210631 A1    Jul. 31, 2014

Related U.S. Application Data

(60) Provisional application No. 61/758,850, filed on Jan. 31, 2013, provisional application No. 61/807,018, filed on Apr. 1, 2013.

(51) Int. Cl.

| | |
|---|---|
| *G08B 5/22* | (2006.01) |
| *G01R 5/28* | (2006.01) |
| *G08B 21/18* | (2006.01) |
| *H01R 13/641* | (2006.01) |
| *H01R 13/717* | (2006.01) |
| *G01D 3/08* | (2006.01) |
| *G01R 13/00* | (2006.01) |
| *G01R 31/28* | (2006.01) |

(52) U.S. Cl.
CPC ........ *G01R 5/28* (2013.01); *G08B 21/18* (2013.01); *G08B 21/185* (2013.01); *H01R 13/641* (2013.01); *H01R 13/7175* (2013.01); *G01D 3/08* (2013.01); *G01R 13/00* (2013.01); *G01R 31/2829* (2013.01)

(58) Field of Classification Search
CPC ...... G01R 5/28; G01R 13/00; G01R 31/2829; H01R 13/7175; H01R 13/641; G01D 3/08; B60R 1/12; G09F 9/33; G08B 5/36; G08B 21/18; G08B 21/185
USPC ............ 340/815.4, 815.45, 815.49, 521, 522, 340/514, 635, 653, 657; 324/537, 522, 133, 324/384, 76.11, 109
See application file for complete search history.

(56) References Cited

U.S. PATENT DOCUMENTS

| | | | |
|---|---|---|---|
| 4,070,290 A | 1/1978 | Crosby | |
| 4,426,612 A | 1/1984 | Wicnienski et al. | |
| 5,359,290 A * | 10/1994 | Cervas ................... | F02P 17/00 324/133 |

(Continued)

OTHER PUBLICATIONS

International Search Report and Written Opinion for International Application No. PCT/US14/11438, filed Jan. 14, 2014, dated May 13, 2014.

(Continued)

*Primary Examiner* — Anh V La
(74) *Attorney, Agent, or Firm* — Hackler Daghighian & Martino

(57) ABSTRACT

An interconnection verification device for sensors and a software implementation of interconnection verification between cabling and sensors in large, multi-channel test configurations are disclosed. In a preferred embodiment the sensor assembly comprises a sensor and an indicator electrically connected inline with the sensor. In a preferred embodiment the indicator is an LED. In an even more preferred embodiment, the sensor is an IEPE.

23 Claims, 7 Drawing Sheets

(56) References Cited

U.S. PATENT DOCUMENTS

| | | | |
|---|---|---|---|
| 5,379,643 A | | 1/1995 | Taylor |
| 5,631,427 A | | 5/1997 | Bridges |
| 5,844,472 A | | 12/1998 | Lee |
| 6,006,164 A | | 12/1999 | McCarty et al. |
| 6,459,919 B1 | * | 10/2002 | Lys .................. A61N 5/0616 315/291 |
| 7,816,925 B1 | * | 10/2010 | Gale .................. G01R 31/021 324/543 |
| 2003/0137310 A1 | * | 7/2003 | Holzel .................. G01R 1/04 324/537 |
| 2010/0244813 A1 | | 9/2010 | Hynd et al. |
| 2012/0035869 A1 | | 2/2012 | Lin et al. |
| 2013/0046436 A1 | * | 2/2013 | McGaughey .......... F04B 17/03 701/33.5 |

OTHER PUBLICATIONS

Original Press release; Hubbell, Inc. (Delaware) / Wiring Device-Kellems Division; *Hubbell Wiring Device-Kellems Introduces Illuminated (LED) Control Connectors*; Thomasnet News, *Control Connectors offer illumination for visual monitoring*; Oct. 31, 2002; 1 page http://news.thomasnet.com/fullstory/Control-Connectors-offer-illumination-for-visual-monitoring-15729.

Hubbell Incorporated, Wiring Device—Kellums; *Micro-Quick™ Quick Disconnect Control Connectors*; undated catalogue; pp. 1-4; Delaware http://www.hubbell-wiring.com/press/pdfs/Hub9817.pdf.

* cited by examiner

CABLE WITH LED CONNECTION INDICATOR AND METHODS OF USING SAME

RELATED APPLICATIONS

This application claims the benefit of U.S. Provisional Patent Application No. 61/758,850, filed Jan. 31, 2013, and entitled "LED Cable End Identifier," and U.S. Provisional Patent Application No. 61/807,018, filed Apr. 1, 2013, and entitled "LED Cable End Identifier Software," both of which are incorporated herein by reference.

FIELD

The present patent document relates generally to cables with light emitting diodes (LED) incorporated therein to indicate the status, location or health of a connected component. The present patent document further relates to software implementations of a connection indicator, and more particularly to an interconnection verification between cabling and sensors in large, multi-channel test configurations.

BACKGROUND

There are costly and challenging methods of verifying interconnections between cabling and a plurality of devices, including but not limited to sensors and the like. Dynamic sensors are transducers that are used to measure dynamic motion or force. Transducers exist in a large variety of shapes and forms, but virtually all consist of two general components: 1) a mechanical structure designed such that the applied motion or force input causes an internal deflection proportional to that input; and 2) an electrical element that measures that deflection such that the electrical output of the sensor is proportional to the magnitude of the deflection. The transduction from deflection to an electrical parameter defines the generic term "transducers" for such devices.

The form of electrical output of a dynamic sensor can vary to include virtually any parameter that is electrically measurable. A common measurement is charge, which is the number of electrons displaced by a dynamic event. However, the measurement might also be the voltage i.e., the electric field strength that caused those electrons to be displaced; the capacitance i.e., the ratio of charge to voltage; the current i.e., the rate of electron flow; the impedance or resistance i.e., the ratio of voltage to current, and so on.

As a non-limiting example, the basic design of a sensor consists of a thin plate of piezoelectric ("PE") material clamped between a base and a mass. The mass serves as the inertial component. When the mounting surface that the base is attached to is accelerated, the inertial mass is also accelerated and results in a force that causes the PE material to deform. This PE property induces electrons to gather on one side of the plate. Electrodes attached to the appropriate surfaces of the plate lead to the electrical cable of the transducer, which communicates the induced electrical variance.

One problem that needs to be overcome in the design of detectors is the shielding from unwanted electrons that can be induced from myriad of external sources. For example, unwanted electrons may be manufactured from external electrical fields or from the rubbing of insulators in the electrical wires delivering the output to the data acquisition system. In order to overcome this problem, the prior art teaches specialized electronics and shielding techniques to reduce the errors caused by such external noise sources. One technique is using a circuit to perform an impedance conversion, internal to the sensor, which translates the quantity of electrons to a voltage level. Once the appropriate voltage is determined, the circuitry floods the output with sufficient electrons, increases the current, to maintain the voltage level while making the undesirable electrons induced by external sources insignificant. This circuitry may be referred to as an amplifier. These sensors along with their amplifier circuits are made by multiple manufacturers under many trademarks (e.g. ICP®, ISOTRON®, DELTATRON®), but can all be grouped under the term Integral Electronic Piezo Electric ("IEPE").

The IEPE may be used in numerous different arenas. For example, the IEPE can be used in the industrial, environmental, military, and aviation fields. It can also be used for device monitoring, environmental monitoring, measuring experiments, seismic monitoring, conditional based machinery monitoring, vibration based alarming, shock detection, intruder deflection, infrastructure monitoring, and loose part detection, to name a few.

IEPE devices use two wires for their output. The first wire is the actual output which carries the additional current and the second wire is ground. The source of power for an IEPE device is a constant current thus, the output of the IEPE device, which represents the time-varying dynamic input to the transducer, takes the form of an analogously time-varying voltage. The time varying voltage component is in addition to the static voltage operating point of the IEPE circuit. The IEPE circuitry design has been extensively used in the industry for a number of reasons including its advantages in reduced noise, reduced cable costs, simplicity of associated external conditioning, and so on.

One characteristic of IEPE devices is that the static voltage operating point does not vary analogously to the parameter to be measured, even if that parameter has significant static value. The output of interest for IEPE devices is the alternating current (AC) (time varying) voltage signal riding on top of the static or "DC" operating point. The AC portion of the output signal does vary analogously with the input being measured.

Regardless of the type of sensor or its output signal, more often than not, numerous sensors may be used to monitor the performance, status or condition of a simple or complex structure or piece of equipment. Sometimes hundreds or even thousands of sensors may be used. Each sensor must be properly electrically connected to the equipment sensing the signal. The sensing equipment may be located far away, and each sensor may be connected through a cable with tens or hundreds of wires. If the sensor is connected to the wrong set of wires, then its output will appear on the wrong channel at the sensing equipment.

In addition to the sensors needing to be wired up to the cable correctly, the other end of the cable may not have a connector and may also need to be wired. Again, if the cable is wired to the sensing equipment incorrectly, the readings will be corrupted. In addition to the physical wiring, any software used within the sensing equipment to manage the various different sensor channels must also be configured correctly. All of these connections must be verified so that when a sensor displays an anomalous reading during use, the operator can be assured that the sensor showing that reading is in fact the sensor located in the physical location the operator thinks it is. Moreover, the operator may want to verify that the sensor is working correctly and the reading is not just from a malfunction of the sensor. All of this creates a verification nightmare.

Accordingly, there is a need to provide a mechanism for verifying the connections of multiple channels coming into a matrix of locations so that an operator can be assured that the sensor showing the measured reading is in fact the sensor located in the physical location he believes it to be. There is a further need to ease the interconnection verification between a plurality of cables and a plurality of sensors. In addition, there is a need to provide for a low cost mechanism to couple a plurality of channels coming into a matrix of locations.

SUMMARY OF THE INVENTION

An object of the present patent document is to provide an improved location identifier for a plurality of sensors. To this end, in one embodiment, a device for interconnection verification is provided that comprises a plurality of cables coupled to a plurality of locations; and an indicator to indicate that the coupling is competent.

Another object of the present patent document is to provide an interconnection verification between cabling and sensors in multi-channel test configurations. A further object of the present patent document is to provide a means to ease interconnection verification between a receiving amplifier and its associated IEPE sensor in multi-channel test configurations using the existing 2-wire IEPE cabling interface. Yet another object of the present patent document is to provide a device or means that can be used to remotely alert and communicate diagnostic feedback, functional failings, and/or improper operational conditions information.

To this end, in one aspect of the present patent document, a sensor assembly is provided. In a preferred embodiment the sensor assembly comprises a sensor and an indicator electrically connected inline with the sensor. In an even more preferred embodiment, the sensor is electrically connected with only two wires. In yet an even more preferred embodiment, the sensor is an Integral Electronic Piezo Electric sensor.

Although in different embodiments different types of indicators may be used, in a preferred embodiment the indicator is a light. In a more preferred embodiment, the indicator is a light-emitting diode (LED). In some embodiments, the light-emitting diode is an infrared light-emitting diode.

In operation of a preferred embodiment, the indicator is turned on and off in parallel with a digital or signaling protocol. In a preferred embodiment, the indicator is turned on and off in parallel with the use of a smart transducer interface module (STIM). In an even more preferred embodiment, the indicator is turned on and off in parallel with a Transducer Electronic Data Sheet (TEDS) request. TEDS is a standardized method of storing transducer (sensors or actuators) identification, calibration, correction data, and manufacturer-related information. TEDS is a data structure stored in a small amount of nonvolatile memory, physically associated with the transducer. The TEDS is used to store parameters which describe the transducer to the network capable application processor (NCAP), making self-identification of the transducer to a system possible. TEDS formats are defined in the IEEE 1451 set of Smart transducer interface standards developed by the IEEE.

In some embodiments, the sensor assembly comprises a plurality of diodes to electrically isolate the indicator when the sensor is in use. In some of those embodiments, the diodes are arranged to allow current to the indicator when a direction of current is reversed from a direction of current used to operate the sensor.

In some embodiments, wireless communication may also be provided. In some of those embodiments the sensor assembly further comprises a wireless transmitter designed to wirelessly transmit status data from the device.

In another aspect of the present patent document, a method of visually verifying location and displaying other operational, health and/or alerting aspects of a sensor is provided. In a preferred embodiment, the method includes the steps of: providing power over a cable to a sensor with a first power supply; and switching from a first power supply to a second power supply and causing an indicator located proximal to the sensor to indicate.

In a preferred embodiment, the switching step causes a current within the sensor circuit to reverse directions. The method is preferably used with a sensor that is an IEPE. In some embodiments, the current switching may be controlled manually, in other embodiments, the current switching may be controlled under software or computer control.

In some embodiments, the second power supply is in electrical communication with the indicator via the cable. In a preferred embodiment the indicator is a light emitting diode (LED).

In another aspect of the present patent document an indicator assembly is provided. In a preferred embodiment, the indicator assembly comprises: a body; a first wire and a second wire in electrical communication with a first electrical connector and a second electrical connector on opposite ends of the body respectively; an indicator visible on the exterior of the body and in electrical communication with the first wire and the second wire; and at least one diode arranged to allow current to flow through the indicator in a single direction.

In a preferred embodiment of the indicator assembly, the first electrical connector and second electrical connector are connected to only two wires. Preferably, the indicator is designed to turn on and off in parallel with a digital or signaling protocol. In a preferred embodiment, the digital or signaling protocol is a Transducer Electronic Data Sheet.

In another aspect of the present patent document, a cable assembly is provided. A preferred embodiment of the cable assembly comprises: a cable including; a first wire and a second wire in electrical communication with an electrical connector designed to mate with a sensor; an indicator integrated into the cable and in electrical communication with the first wire and the second wire; and at least one diode arranged to allow current to flow through the indicator in a single direction.

DETAILED DESCRIPTION OF THE PREFERRED EMBODIMENTS

The terms "computer-readable storage medium" and "computer-readable storage media," as used herein, refer to a medium or media that participates in providing instructions to a CPU for execution. Such media may take many forms that include, but are not limited to, non-volatile and volatile media. Non-volatile media include optical or magnetic disks, such as fixed disks. Volatile media include dynamic memory, such as system RAM. Common forms of computer-readable storage media include, for example, floppy disks, flexible disks, hard disks, magnetic tape, any other magnetic media, CD-ROM disks, digital video disks (DVDs), any other optical media, punch cards, paper tape, any other physical media with patterns of marks or holes, RAM, PROM, EPROM, FLASHEPROM, and any other memory chip or cartridge.

Figure 1:
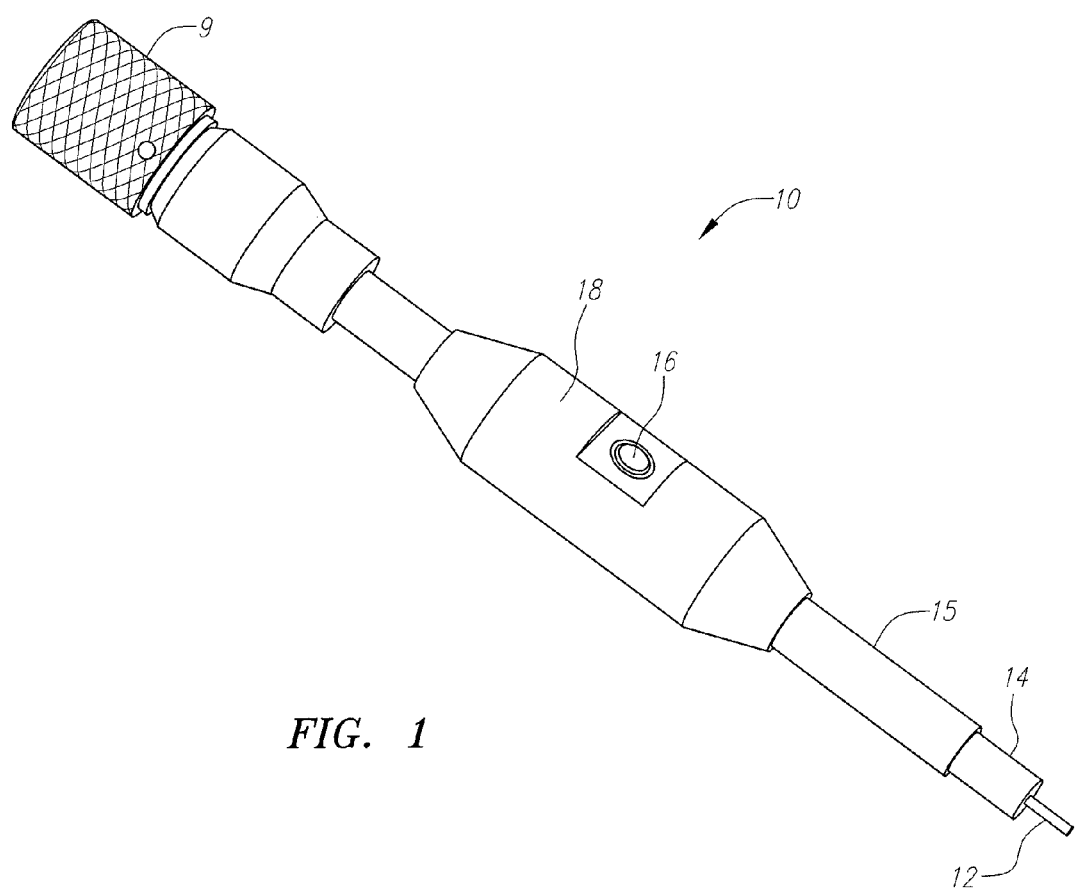
FIG. 1 illustrates an isometric view of one embodiment of a sensor cable assembly including a mating sensor connector and an indicator assembly with an indicator designed to indicate a status.

FIG. 1 illustrates an isometric view of one embodiment of a sensor cable assembly 10 including a mating sensor connector 9 and an indicator assembly 18 with an indicator 16 designed to indicate a status. Indicator assembly 18 is coupled to cable 15. Cable 15 includes wires 12 and 14. The cable assembly 10 may be connected to any type of sensor via the mating sensor connector 9. The sensor (not shown) may be designed to measure dynamic pressure, force, strain, acceleration or any other physical phenomena. In a preferred embodiment, the cable assembly 10 has an electrical configuration compatible with an IEPE sensor. However, in other embodiments, the cable assembly 10 may have any other type of electrical configuration. In some embodiments, the cable assembly 10 may be configured to be compatible with a Piezoelectric ("PE") sensor or any other type of sensor.

In the embodiment shown in FIG. 1, the sensor assembly 10 has one or more indicators 16 embedded within the indicator assembly 18. In the embodiment shown in FIG. 1, the indicator 16 is an LED. However, in other embodiments, the indicator 16 may be any type of indicator including, a light, thermally sensitive material, switch acoustic actuator or any other type of component that can convey a status, binary or otherwise.

In use, cable assembly 10 is coupled to a sensor. The indicator 16 is toggled to display the status of the sensor mated to cable assembly 10. The status being displayed may be any type of status, including but not limited to the status of: a proper power connection, data connection, functioning sensor, cable integrity, circuitry health, sensor calibration, interconnection verification, end identification and/or position locating, diagnostic feedback, or any other type of status. To this end, more than one indicator 16 may be used. In the preferred embodiment, the indicator 16 is a binary indicator such as a light that is on or off. However, other more sophisticated indication schemes may be used to allow a single indicator 16 to display multiple statuses. As just one non-limiting example, the indicator 16 could blink with different frequencies to indicate different conditions. If multiple indicators 16 are used, each indicator 16 could individually display a binary status. In other embodiments, patterns of binary indicators may be used to display even more complicated statuses.

In a preferred embodiment, cable assemblies 10 including the indicator assembly 18 allow a user to cause the indicator 16 to indicate on command. As one example to demonstrate the point, assume there is an engine under test with multiple sensors assemblies located at different locations throughout the engine. Each sensor is connected with a cable assembly 10 that includes an indicator assembly 18 using an LED as an indicator 16. All of the sensors are wired back through cable assemblies 10 to a sensor instrument designed to acquire and determine the output of each sensor. Assume during the test the user sees an anomalous value being read out on the sensor instrument and that anomalous value shows the problem is associated with the sensor attached to channel 7. Assume this particular sensor is supposed to be the sensor attached to the turbo pump. Given this example, in the old systems, the user would have no easy way to verify that the system was actually wired up and configured correctly so that the user could be assured that the anomalous value being indicated at the sensor instrument was actually coming from the sensor physically attached to the turbo pump.

In the embodiments of the present patent document, a user can instruct the LED indicator 16 associated with channel 7 to blink or turn on. In a preferred embodiment, this is done via software. The system then sends a signal over the wires associated with channel 7 that would cause the LED to blink. If the user visually sees the LED on the cable assembly 10 attached to the sensor on the turbo pump blink or turn on, the user can be assured that the anomalous reading is coming from that particular sensor and everything is wired correctly. To this end, the embodiments of the cable assembly 10 with indicator assembly 18 provide an end-to-end verification of the correct wiring and placement of a multitude of sensors assemblies in a multi-sensor system.

In a preferred embodiment, the indicator assembly 18 including the indicator 16 is wired "inline" with the sensor. In the context of this specification, "inline" means that the same wires used to receive the signal from the sensor and power the sensor are used to provide power to the indicator 16. "Inline" does not require that the indicator 16 be wired in parallel or series but only rather that the same wires used to operate the sensor are also used to provide power to the indicator 16 without additional wiring. Wiring the indicator 16 inline has a number of advantages to using additional wires. One advantage is that no additional wiring or modifications are needed to existing sensors. Another advantage is that by using the exact same wires the signal is received on, the correct wiring can actually be verified. If additional wiring is used, additional errors may exist in the wiring of the indicators, which would circumvent the verification process.

Figure 2:
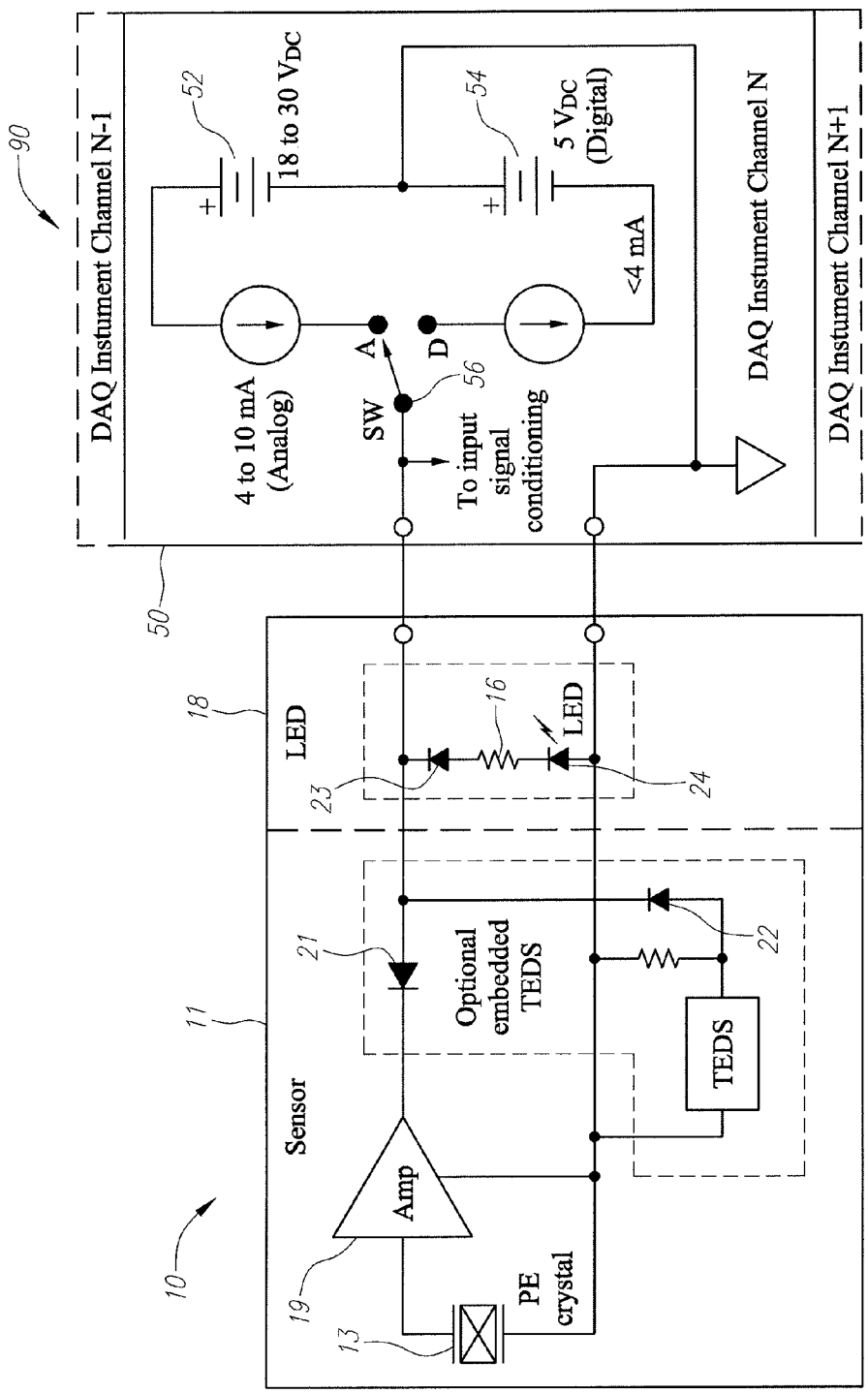
FIG. 2 illustrates a schematic view of a sensor system including a sensor connected with a cable assembly including an indicator assembly.

FIG. 2 illustrates a schematic view of a sensor system 90 including a sensor 11 connected with a cable assembly 10 including an indicator assembly 18. In the preferred embodiment shown in FIG. 2, the indicator assembly 18 is wired inline with the sensor 11. While systems may be used with additional wires for the indicator assembly 18, inline wiring is preferred.

In systems with inline wiring, a switching mechanism is needed to allow the indicator to be toggled to various statuses over the same wires that typically carry the sensor signals. In the embodiment shown in FIG. 2, this is achieved using switch 56. Switch 56 toggles between two different power sources 54 and 56, one with a positive voltage 54 and one with a negative voltage 56. When switch 56 (SW1) toggles between position A and position D, the flow of current throughout the sensor and cable assembly 10 is reversed. The placement of diodes 21, 22, 23 and 24 prevent current flow to the sensor electronics and cause the LED indicator 16 to light up.

The electrical configuration shown in FIG. 2 is only one embodiment of many for wiring an indicator 16 inline. In other embodiments, other inline wiring may be used. The embodiment illustrated in FIG. 2 was chosen because it illustrates the typical already existing wiring of an IEPE sensor that includes Transducer Electronic Data Sheet ("TEDS"). Systems designed to support IEPE sensors with TEDS already include diode 21 and 22 and switch 56 along with power supplies 52 and 54. To this end, an IEPE system with TEDS may be adapted to an embodiment of the present patent document by adding indicator assembly 18. Indicator assembly 18 may be built into a cable assembly 10, built into the sensor itself or provided inline with an adapter. A TEDS sensor and/or actuator are/is not required to take advantage of this inline indicator implementation.

To this end, the voltages and currents along with digital and analog markings of the embodiment shown in FIG. 2 are typical of an IEPE system with TEDS. However, in other embodiments other voltages and currents may be used. In addition, the indicator assembly 18 may be implemented as either an analog or digital system. The type and design of the power supplies used may drive the type of indicator 16 that may be used. In systems like the one shown in FIG. 2, where current is low, indicators 16 that work with low current such as LEDs are preferred. However, in other embodiments, other power sources may be used and different types of indicators 16 may be used.

In the embodiment shown in FIG. 2, the indicator 16 is wired to be a simple binary on/off indicator 16. However, in other embodiments, switch 56 may be more advanced and allow more advanced methods of indication. For example, if the switch 56 is a three position switch, the switch 56 may be toggled to cause indicator 16 to blink or even blink with different frequencies such that a more sophisticated signaling is enabled.

In yet other embodiments, rather than being wired in parallel with a control protocol such as a TEDS system, the indicator system 18 may be wired in series with the control protocol and be controlled by a controller within the system. To this end, the controller, which would receive the power when switch 56 was toggled into position D, would then control the indicator 16. Such control may be sophisticated such that the indicator 16 could blink at any number of frequencies or turn on or off. In addition, more than one indicator 16 may be used.

Digital processing allows much more intricate control and allows indicator assembly 18 to be more versatile. As just one example, the indicator 16 may be toggled on or off in parallel with the acquisition of a digital or signaling protocol. This provides visible and verifiable location readout and diagnostic feedback without impacting the performance of the IEPE sensor. In a preferred embodiment, the digital or signaling protocol is Transducer Electronic Data Sheet ("TEDS") data. However, in other embodiments, other digital signaling protocols may be used.

As shown in FIG. 2, in a preferred embodiment, the status indicating assembly 18 is designed to work with an IEPE sensor. In such embodiments, the IEPE sensor 11 contains a sensing element 13 made of a PE material that converts mechanical strain into an electrical signal, and an electronic circuit 19 to amplify the electrical signal and transmit it to an external recording device 50 (DAQ Instrument). The built-in electronics in the amplifier 19 convert a high-impedance charge signal that is generated by the PE sensing element 13 into a usable low-impedance voltage signal that can be transmitted over ordinary two-wire or coaxial cables 15 to any voltage readout or recording device. The low-impedance signal can be transmitted through long cables and used in dirty field or factory environments with little degradation. In addition to providing crucial impedance conversion, IEPE sensor circuitry can also include other signal conditioning features, such as gain, filtering, and self-testing.

The electronics within the IEPE sensor 11 require excitation power from a constant-current regulated, direct current ("DC") voltage source. A separate signal conditioner can be provided when none is built into the readout. In addition to providing the required excitation, power supplies may also incorporate additional signal conditioning, such as gain, filtering, buffering, and overload indication.

Although in a preferred embodiment indicator assembly 18 is used to verify the wiring of a sensor 11, indicator assembly 18 may indicate any number of sensor statuses. In one embodiment of the present patent document, the status indicating assembly 18 is designed to verify the interconnection between an amplifier 19 and its associated sensor 13. This may be especially important if the sensor is not an IEPE sensor where the amplifier 19 is built in.

The IEPE sensor may be used in numerous different arenas. Use and maintenance of a sensor usually requires conducting a performance analysis and fault diagnosis of the working status and the interconnecting circuits of the sensor. As discusses above, the embodiments of the present patent document help alleviate some of the numerous problems associated with conducting such a performance analysis and fault diagnosis and verification.

This patent document is not limited to the TEDS protocol; any type of digital signal or control signaling may be used, but TEDS is a working example. In a preferred embodiment of the present patent document, TEDS stores the IEPE identification, calibration, and correction data, and manufacturer-related information. In another preferred embodiment, TEDS is implemented as a memory device attached to the transducer and containing the information needed by a measurement instrument or control system to interface with a transducer. TEDS can reside in embedded memory within the transducer itself, which is connected to the IEPE sensor. The embedded memory is typically an EEPROM.

Figures 3, 4:
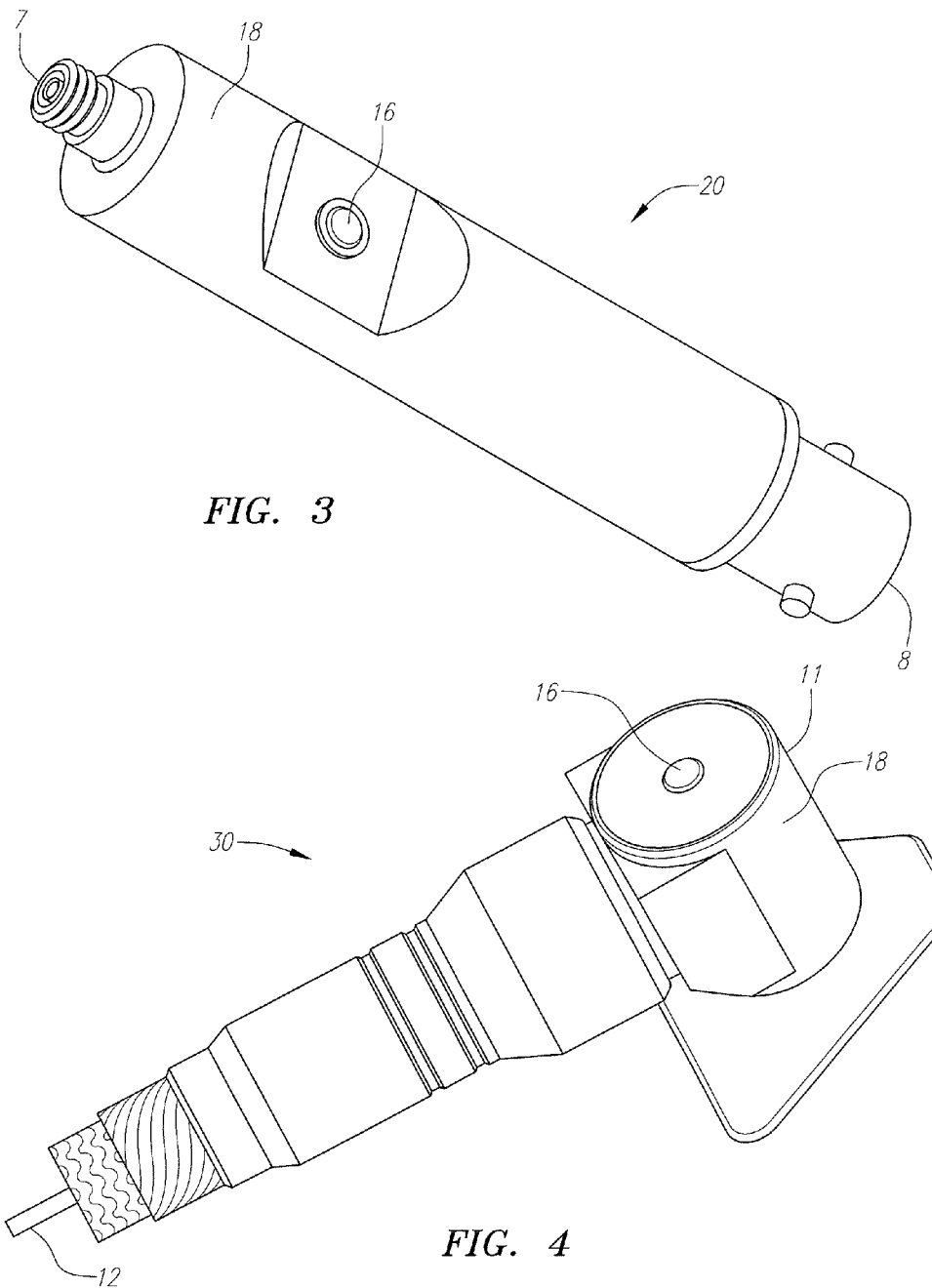
FIG. 3 illustrates an isometric view of one embodiment of a retrofit indicator assembly designed to be retrofit to existing cables and/or sensors.
FIG. 4 illustrates an isometric view of one embodiment of a sensor assembly including an indicator built into the sensor.

In a preferred embodiment, the interconnection verification system uses one or more indicators 16 to assist with sensor status. As shown in FIG. 3, in one preferred embodiment, the status indicating assembly 18 may be design so that it can be retrofit into existing systems. FIG. 3 illustrates an isometric view of a retrofit indicator assembly 20. Retrofit indicator assembly 20 includes an indicator assembly 18 and two cable adapters 7 and 8. Accordingly, retrofit indicator assembly 20 may be connected inline between the sensor and the cable designed to connect to the sensor. To this end, the functionality of the indicator assembly 18 may be adapted to existing sensors and existing sensor systems. A preferred embodiment of the retrofit indicator assembly 20 supports two-wire, IEPE physical test infrastructures and enables a controllable on/off indication at a remote location of the IEPE.

In a preferred embodiment, if the indicator is wired in parallel with another system such as TEDS, the indicator should use sufficiently low current to not hinder the operation of the sensor system. In a preferred embodiment where the indicator 16 is wired in parallel with a TEDS system, a low current LED is used. A low current LED allows the TEDS to work normally when required. In a preferred embodiment, the packaging and location of the LED is selected to provide the greatest angle of overall visibility.

In one embodiment, the host's TEDS application software may be changed to control the pattern of when the LED 16 turns on or off. As a non-limiting example, the LED current may be continuous. As another non-limiting example, the LED 16 may blink slowly, such as at 0.2 to 2.0 Hz, to facilitate easy human visual detection.

The embodiments of the present patent document may provide interconnection verification at a lower cost when used for validating large channel count setups. In particular, the embodiments disclosed herein provide for easier location, identification, and replacement of a specific IEPE sensor, particularly in a large, multi-channel configuration with a cable adaptor with IEPE sensors.

In some embodiments, a detector may be used to automate the verification of the response of the sensor assemblies. The detector may be a CCD camera with image recognition software that can locate and verify when the indicators that illuminate. In other embodiments the detector may be an infrared tracking system. In embodiments including automation, the system may include LEDs, cameras, and software such as those used in the animation and movie industry to model and improve how living creatures move. Accordingly, in some embodiments, the indicator 16 may be an infrared LED and the interconnection verification further comprises an infrared camera and auto-locating vision software to automate the verification loop.

In some embodiments, especially those where the indicator 16 is wired to a controller such as a TEDS controller (Network Capable Applications Processor—NCAP), the indicator 16 may be used as a diagnostic tool if the indicator 16 is programmed to light up or flash at different frequencies, depending on whether a certain condition is present. The condition could be a problem condition, such as failed wiring or a faulty sensor or cable. As a non-limiting example, the indicator 16 may light up if the sensor is accelerated faster than a threshold level of acceleration. This may indicate to the test technician that the sensor range for acceleration is too low and needs to be increased. In other embodiments, other conditions may be indicated.

In some embodiments, the sensor system may transmit wireless data relative to the LED indicator. The wireless data may be status data or may be another kind of data. For example, the sensor system may wirelessly transmit the sensor data associated with the TEDS system. In wireless embodiments, a threshold may be set at the sensor interface to manage the sensitivity of the validation. As a non-limiting example, a threshold associated with an indicator 16 may require that visual information be detected for a predetermined number of seconds. As another non-limiting example, a threshold associated with light levels may require that a predetermined light level be reached.

FIG. 4 illustrates an isometric view of one embodiment of a sensor assembly 30 including an indicator 16 built into the sensor 11. The embodiment shown in FIG. 4 may be a custom built sensor with indicator 16. The embodiment shown in FIG. 4 may have the same electrical configurations as the embodiments of the form shown in FIG. 1; however, the indicator assembly 18 is physically built into the sensor instead of the cable assembly. One advantage of the embodiment shown in FIG. 4 is that the indicator assembly may be placed closer to the sensor head rather than proximal but down on the cable.

Figure 5:
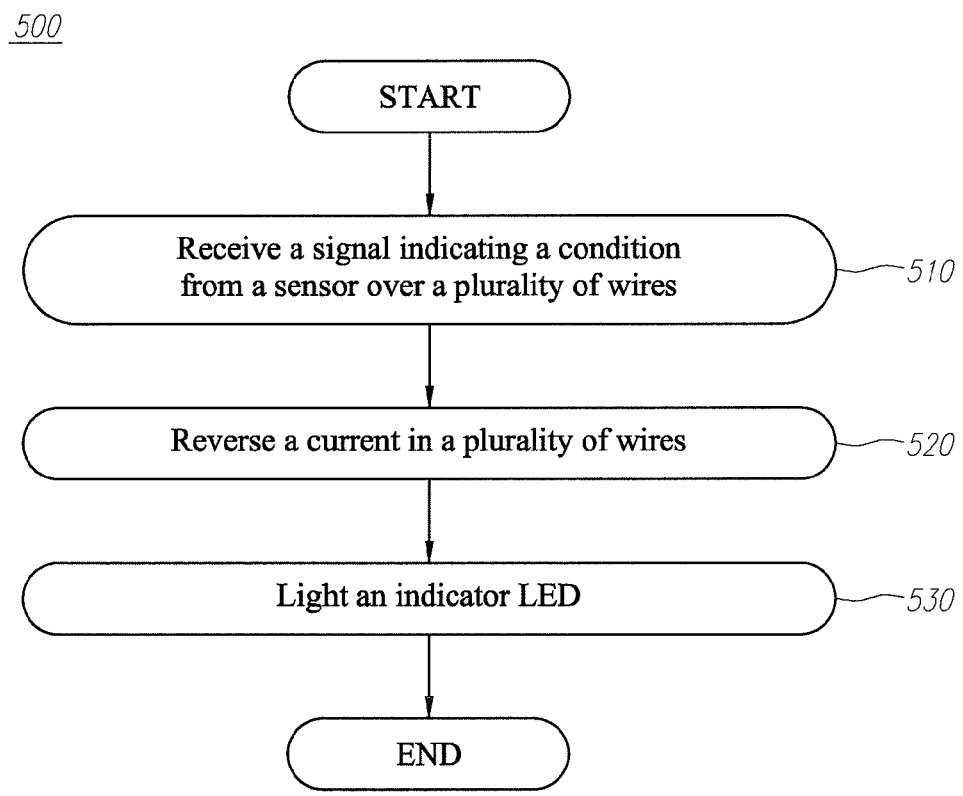
FIG. 5 is a flowchart that illustrates a verification method with an indicator that provides visual feedback for a camera system, human, etc.

FIG. 5 is a flowchart that illustrates a verification method with an LED indicator that provides visual feedback for a camera system, human, etc. The steps and order of steps identified in FIG. 5 are exemplary and may include various alternatives, equivalents, or derivations thereof. Intervening steps may be possible in other embodiments. The steps of the method of FIG. 5 and its various alternatives may be embodied in hardware or software, such as a computer-readable storage medium (e.g., optical disc, memory card, etc.) comprising instructions executable by a processor of a computing device.

In the method 500, step 510 is receiving a signal indicating a condition from a sensor over a plurality of wires. In a preferred embodiment, the signal is sent from a wired sensor and received by a sensor interface. In embodiments where a wired sensor is capable only of detecting one type of condition, the type of sensor and the condition it detects may have been previously identified or provided to the sensor interface.

Step 520 reverses current in the plurality of wires. Step 530 is to light an indicator LED. Determining whether a threshold associated with the type of LED indicator environmental condition has been met. Step 540 verifies the location of the sensor.

Figure 6:
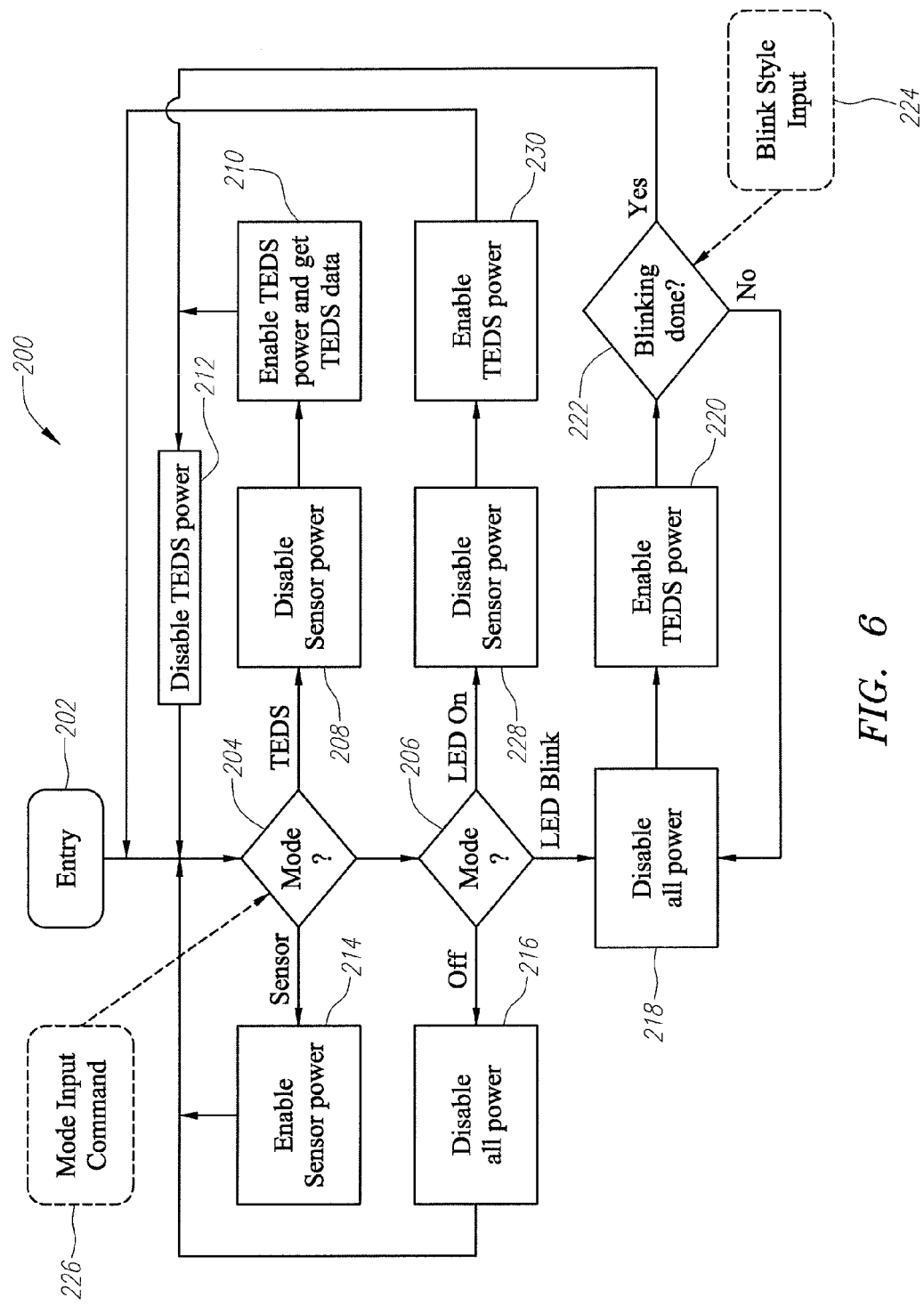
FIG. 6 is a flowchart that illustrates a method for controlling a sensor assembly including an indicator assembly.

FIG. 6 illustrates a method for controlling a sensor assembly 10 including an indicator assembly 18. In the method shown in FIG. 6, the control algorithm is entered at 202. A decision 204 is made whether to use the sensor, use the TEDS, or light the indicator light. In embodiments where the LED light is wired in parallel with the TEDS system, the LED light may always light when the TEDS is powered and this decision may be simplified.

If decision 204 is to use the sensor, the control proceeds to block 214 and the sensor power is enabled. Once the sensor power is enabled, the control returns back to block 204 where it stays until a state change is requested. The state change may come from any input source. In a preferred embodiment, the state change input may come from a Mode Input Command 226. In a preferred embodiment, this may be input by a user, via any number of well known user inputs, GUI, keyboard, command line, mouse, etc.

If the state change is received and changed to TEDS, the control proceeds to step 208. If the sensor power is enabled, the sensor power is disabled in step 208. Once the sensor power is disabled in step 208 control proceeds to step 210 and the TEDS power is enabled and the TEDS protocol may be used. All functions supported by the protocol may be used including the get TEDS data command. Although the TEDS protocol is used in the example shown in FIG. 6, the embodiments described herein are not limited to the TEDS protocol and any protocol may be substituted for TEDS.

Once the use of the TEDS protocol has finished, the TEDS power is disabled and control is returned to block 204 to await a state change. If the mode is changed to indicator mode (LED as one example) the process proceeds to step 206. If in step 206 the indicator is to be turned on, the control proceeds to step 228 and the sensor power is disabled. Control then proceeds to step 230 and TEDS power is enabled.

As control proceeds to step 206 and the LED indicator light is on and needs to be turned off, step 216 is initiated and all power is disabled. Once the power is disabled in step 216 control is returned to step 204 and a state change is again awaited.

As control proceeds to step 206 and the control is set to cause the LED indicator to blink, control proceeds to step 218 and all power is disabled. Control then proceeds to step 220 and the TEDS power is enabled. When in blinking mode and the TEDS power is enabled, the control proceeds to a small state machine that controls the blinking in step 222. If the LED is supposed to continue blinking, then steps 218 and 220 are repeated and the control returns to step 222. If the blinking should stop, the control proceeds to step 212 and the TEDS power is disabled.

In one embodiment, an optional blink style input module may provide input to the blinking state machine 222. The blink style input step 224 may send an input to the blinking state machine 222 as to a frequency or type of blink desired. In such an embodiment, step 222 may be equipped with a delay and more particularly a variable delay that can cause different types, frequencies or sequences of blinks.

In systems that employ the TEDS protocols, power is usually transferred to the TEDS protocol only long enough to request the sensor data. Once the sensor data is received, the power is automatically returned to the sensor. In order to implement the embodiments of the present patent document, the driver controls the power to the TEDS system may need to be modified in order to allow longer periods of power to the inline indicator 16.

The Institute of Electrical and Electronics Engineers (IEEE) proposed standard IEEE-P1451.2 to define a standard method for transducer to microprocessor communications and TEDS formats. The IEEE-P1451.2 draft standard is incorporated herein by reference in its entirety. The IEEE-P1451.2 draft standard gives a technical overview of the Smart Transducer Interface Module (STIM). The IEEE-P1451.2 standard further describes how a Network Capable Application Processor NCAP, interfaces with one or more transducers through a STIM.

Although in various different embodiments any transducer interface may be used, the preferred embodiments of the systems, apparatuses and methods described herein are implemented within the framework of the IEEE-P1451.2 standard. Those embodiments preferably control the indicator via the same basic method a TEDS request would be made. However, more sophisticated software to control the indicator via the TEDS request channel may be needed. As just one example, typically when a TEDS request is made, the data would be retrieved and use of the sensor would be immediately returned. However, in embodiments of the present patent document, power to the TEDS request mechanism might be sustained for a longer period of time to enable the LED indicator to remain lit and be visually appreciated.

Figure 7:
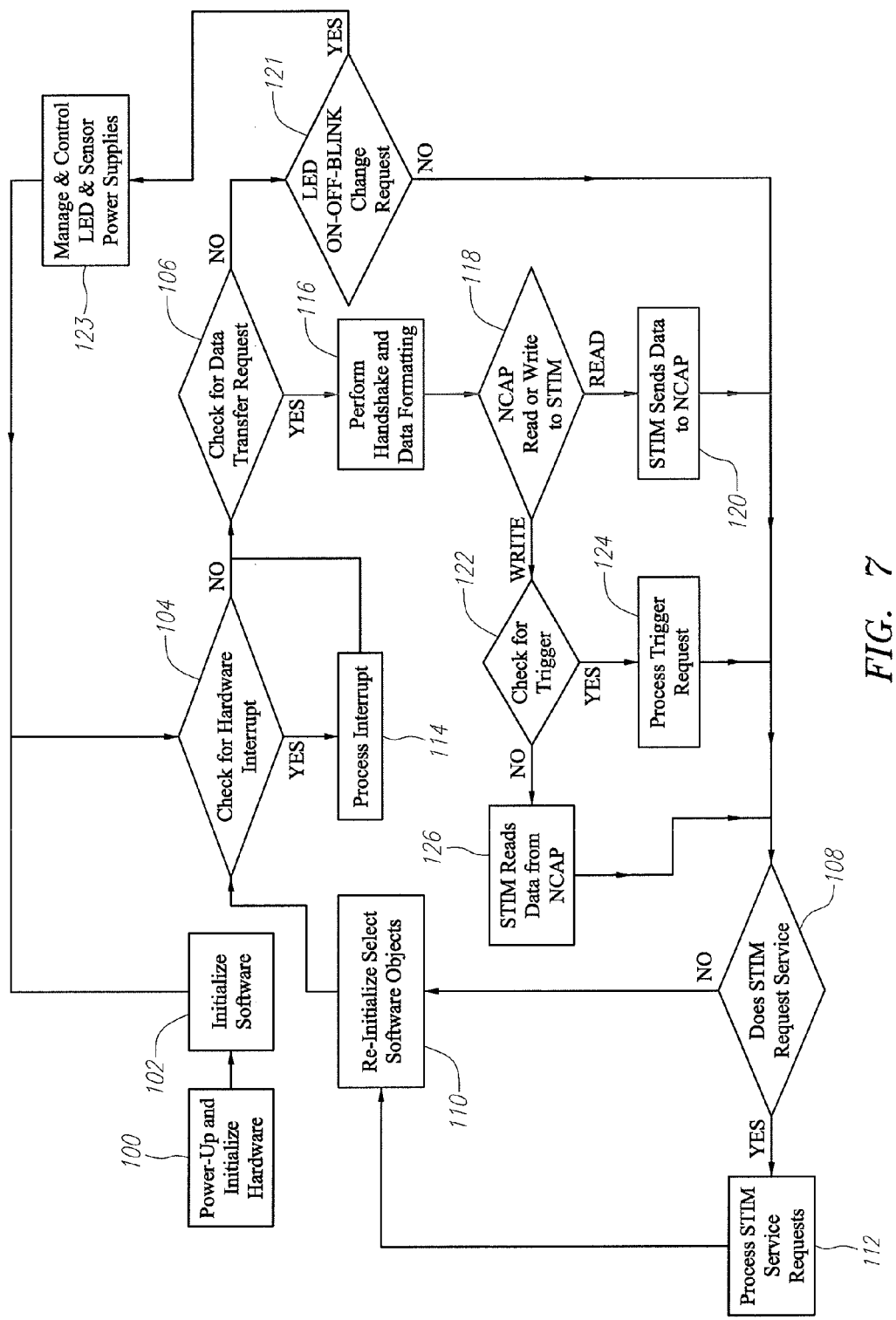
FIG. 7 illustrates one embodiment of software operation and control of a system with TEDS sensors and/or actuators that include LED indicators for visual information signaling.

FIG. 7 illustrates one embodiment of software operation and control of a system with TEDS sensors and/or actuators that include LED indicators for visual information signaling. In particular, FIG. 7 illustrates the operation of one of the main subsystems. Other software routines may be implemented concurrently. FIG. 7 shows how software operating on an NCAP may control the use of sensors or actuators including LED indicators.

In step 100 the hardware initializes and powers up. This readies the main board for initialization routines that will sets sensors, actuators, LED indicator visual information or other specific control signals, and reads configuration jumpers. Step 102 initializes software routines. This sets up the microcontroller, hardware input/output lines, and software data structures. The main loop begins at decision block 104, which checks for hardware interrupts. If there is no hardware interrupt, then decision block 106 checks for data transfer requests. If there are no data transfer requests, then block 121 determines whether there is an LED change request. If there is not an LED change request then decision block 108 determines the need for sensor information. Particularly, block 108 determines if there is a need for acquiring sensor data or servicing due to problem conditions. Servicing may include checking on the attached sensors etc.; sending a trigger to acknowledge or indicate that the system has run out of consumables, such as in cases of low battery; indicating a self-test failure; indicating calibration fail; or other self-validation messages. If there is no need for servicing, then select software objects are reinitialized at block 110 and the program returns to decision block 104. If the sensor information indicates a request for service, then the sensor service requests are processed at block 112. Once the service requests have been processed, the program proceeds to block 110.

Returning to block 121 to process the other leg of the decision tree, if there is an LED change request received in block 121, then control is passed to block 123 to manage and control LED and sensor power. Finally, once the indicator (LED) is done being controlled, the process returns to block 104.

If a hardware interrupt is received at decision block 104, then the interrupt is processed at block 114. The hardware interrupt can arise from any one of several conditions generated by hardware elements in the unit. If there is no hardware interrupt, then upon completion of reset, the program proceeds to decision block 106. If there is an active data transfer request to send information to or receive information from the NCAP, then block 116 performs handshake and data formatting. Decision block 118 determines the type of data transfer request, either an NCAP read or write.

If the data transfer request is for an NCAP read, then at block 120, the NCAP sends data commands to the sensor. The sensor replies by sending the requested information back to the NCAP for interpretation and use. The information can be a sensor measured value, TEDS I.D. information, and the like. The program then proceeds to decision block 108.

If the data transfer request is to write information from the NCAP to the sensor, then decision block 122 checks for software trigger requests. If there are software trigger requests, then the trigger requests are processed at block 124. The trigger requests may consist of changing the state of an actuator or reading sensor hardware. If there is no software trigger request, then at block 126 the sensor reads data command sent from the NCAP. As a non-limiting example, this command may be to set an actuator output voltage or update sensor calibration coefficients.

From either block 124 or 126, the program returns to block 108.

The software embodiment illustrated in FIG. 7 is just one embodiment for controlling a sensor and it associated indicator. In the embodiment shown in FIG. 7, control of the indicator is separated in blocks 121 and 123 from other functions related to management of the sensor. However, in other embodiments, indicator management and control may be more integrated.

Figure 8:
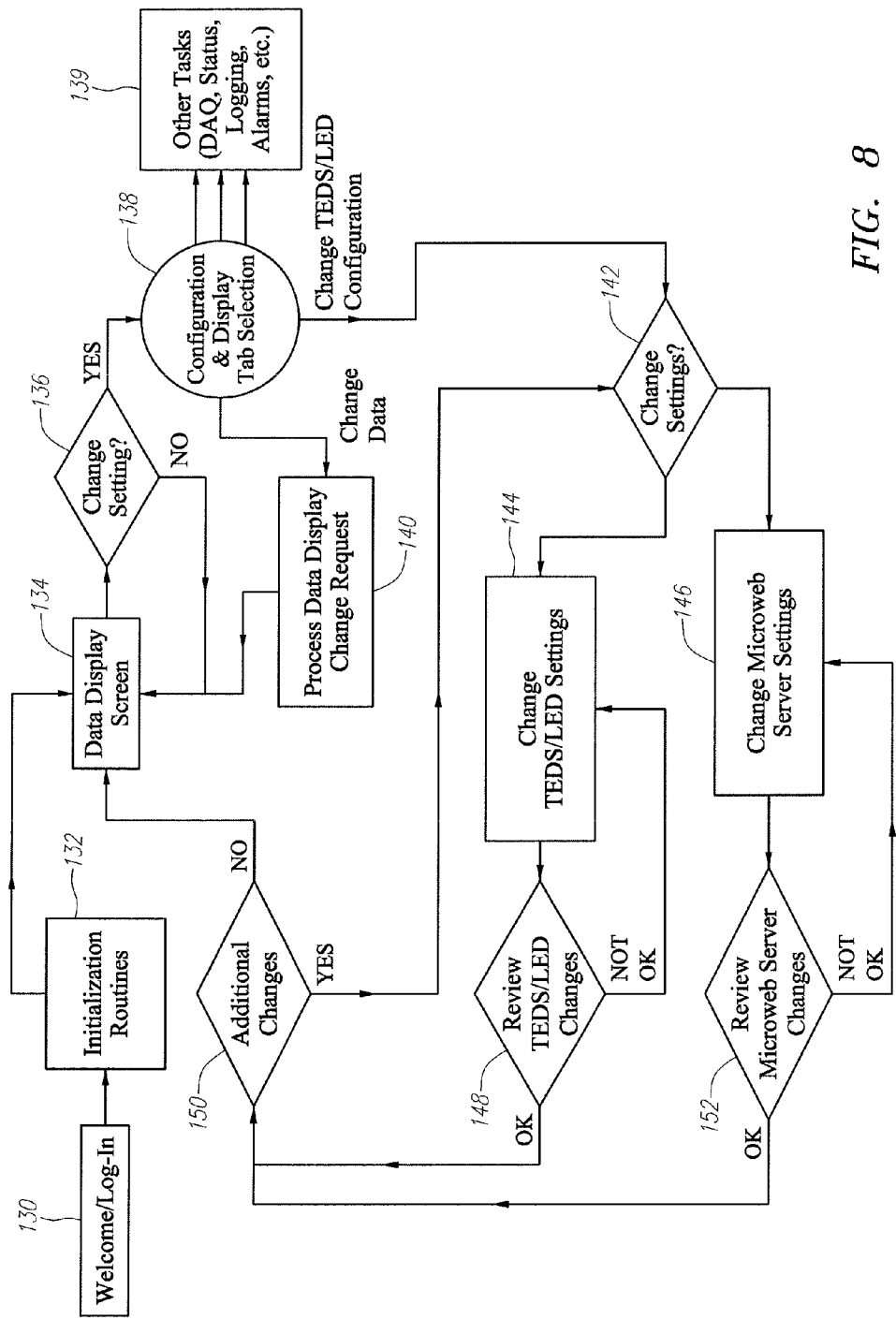
FIG. 8 is a flow diagram illustrating the operation of one embodiment of HTML/JAVA client software stored and executed on the user's personal computer.

FIG. 8 is a flow diagram illustrating the operation of one embodiment of client software designed to control a sensor or actuator including an indicator. In some embodiments the software may be stored and executed on the user's personal computer. In some embodiments the software may be programmed in HTML and/or JAVA. The embodiment illustrated in FIG. 8 begins at block 130, which implements a welcome screen at user log-in. Particularly, HTML welcome screens at log-in allow for user configuration information to be sent to the user over the network. Block 132 then implements any necessary initialization routines. This may include querying the sensor to download data from the TEDS for unit information and downloading transducer-specific data from the TEDS for each implemented sensor channel and each actuator channel. A data display screen is generated at block 134 as per the user configuration file. Default settings are used if the user has not updated configuration information. As before, this display screen is sent through the network for display via the user's browser software. Decision block 136 determines if it is necessary to change any settings. This may be implemented by tab selection. If it is not necessary to change any settings, then the program returns to block 134. Thus, the program repeats the steps in a loop consisting of blocks 134 and 136 unless changes are selected or the user logs off.

If a tab selection is made to make changes at decision block 136, then the particular type of tab selection is determined at node 138. One possible change is to change the data display. This is implemented at block 140, which is processed at a data display change request. Particularly, the user selects a transducer channel display, display format, and display parameters. As a non-limiting example, this may include graph style, sample frequency, graph axes parameters, and graph axes labels. The program validates the user's selections for compatibility with the hardware and the data in the TEDS and the software capabilities. The program then returns to block 134 to display the data screen.

If the tab selection at node 138 was to change TEDs and/or indicator (LED) configuration, then decision block 142 determines whether the transducer settings to be changed were for TEDS information or for micro-web server default settings or for some other reason such as illuminating the indicator on a particular sensor or actuator. If the transducer settings to be changed were for TEDS information or LED illumination, then the program proceeds to block 144 to change the TEDS settings and/or the indicator settings. If the transducer settings to be changed were for micro-web server default settings, then the program proceeds to block 146 to change the micro-web server settings.

If the selected change was to TEDS or LED settings at block 144, then the user selects the transducer channel to change and the particular parameter to change from a menu list of available TEDS or LED fields indicating current and/or available values. This consists of details of the sensors' parameters and LED functional indication types. Decision block 148 reviews the TEDS and LED changes to verify that they are within range and the like. If not, the program returns to block 144. Otherwise, the program advances to block 150 to determine if there are any additional changes. If there are no additional changes, then the program returns to block 134. If there are additional changes, then the program returns to decision block 142.

Other types of configuration changes may be handled by block 139. In block 139, other types of configuration changes include but are not limited to data acquisition configuration, logging, status or alarms.

Although the inventions have been described with reference to preferred embodiments and specific examples, it will readily be appreciated by those skilled in the art that many modifications and adaptations of the methods and devices described herein are possible without departure from the spirit and scope of the inventions as claimed hereinafter. Thus, it is to be clearly understood that this description is made only by way of example and not as a limitation on the scope of the inventions as claimed below.

What is claimed is:

1. An assembly comprising:
a sensor in electrical communication with a wire;
an indicator electrically connected inline with the sensor using the same wire;
a first power supply arranged to have a positive voltage;
a second power supply arranged to have a negative voltage;
a switch configured to toggle electrical communication between the wire and the first and second power supply;
a first diode in series with the sensor and arranged to allow current to flow through the sensor when current is flowing on the wire in a first direction; and
a second diode in series with the indicator and arranged to allow current to flow through the indicator when current is flowing on the wire in an opposite direction from the first direction.

2. The assembly of claim 1, wherein the sensor is electrically connected with only two wires.

3. The assembly of claim 2, wherein the sensor is an Integral Electronic Piezo Electric sensor.

4. The assembly of claim 1, wherein the indicator is a light.

5. The assembly of claim 4, wherein the indicator is a light-emitting diode (LED).

6. The assembly of claim 5, wherein the light-emitting diode is an infrared light-emitting diode.

7. The assembly of claim 1, wherein the indicator is turned on and off in parallel with a digital or signaling protocol.

8. The assembly of claim 7, wherein the digital or signaling protocol supports a Transducer Electronic Data Sheet request.

9. The assembly of claim 1, further comprising a wireless transmitter designed to wirelessly transmit status and/or measurement data from the sensor.

10. The assembly of claim 1, further comprising a digital controller electrically connected inline with the sensor and between the indicator and the switch such that the digital controller receives power from the wire and controls power to the indicator.

11. A method of verifying a sensor circuit comprising the steps of:
placing a wire electrical communications with a first power supply and providing power over the wire to a sensor;
switching electrical communication of the wire from the first power supply to a second power supply;
providing power from the second power supply over the same wire;
preventing current flow to the sensor from the second power supply;
allowing current flow from the second power supply over the same wire to an indicator located proximal to the sensor; and
causing the indicator to indicate.

12. The method of claim 11, wherein the switching step causes a current into the sensor circuit to reverse directions.

13. The method of claim 11, wherein the sensor is an IEPE.

14. The method of claim 12, wherein current flow is prevented from flowing to the sensor by at least one diode.

15. The method of claim 11, wherein the indicator is a light emitting diode (LED).

16. An indicator assembly comprising:
a body;
a first wire and a second wire in electrical communication with a first electrical connector and a second electrical connector on opposite ends of the body respectively;
an indicator visible on the exterior of the body and in electrical communication with the first wire and the second wire; and
wherein the indicator is electrically connected in parallel with the first and second wires and the indicator is in series with at least one diode.

17. The indicator assembly of claim 16, wherein the first electrical connector and second electrical connector are connected to only two wires.

18. The indicator assembly of claim 16, wherein the indicator is a light.

19. The indicator assembly of claim 18, wherein the indicator is a light-emitting diode (LED).

20. The indicator assembly of claim 19, wherein the light-emitting diode is an infrared light-emitting diode.

21. The indicator assembly of claim 16, wherein the indicator is designed to turn on and off in parallel with a digital or signaling protocol.

22. The indicator assembly of claim 21, wherein the digital or signaling protocol supports a Transducer Electronic Data Sheet request.

23. A cable assembly comprising:
a cable including;
a first wire and a second wire in electrical communication with an electrical connector designed to mate with a sensor;
an indicator integrated into the cable and in electrical communication with the first wire and the second wire;
a first diode between the indicator and the first wire;
a second diode between the indicator and the second wire;
wherein the diodes are oriented to prevent current from flowing through the indicator when current is flowing to the sensor.

* * * * *